United States Patent
Kobayashi

(10) Patent No.: US 9,509,289 B2
(45) Date of Patent: Nov. 29, 2016

(54) OSCILLATION CIRCUIT AND PHASE SYNCHRONIZATION CIRCUIT

(71) Applicant: KABUSHIKI KAISHA TOSHIBA, Tokyo (JP)

(72) Inventor: Hiroyuki Kobayashi, Yokohama Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/636,009

(22) Filed: Mar. 2, 2015

(65) Prior Publication Data

US 2016/0028406 A1 Jan. 28, 2016

(30) Foreign Application Priority Data

Jul. 24, 2014 (JP) ................................. 2014-151181

(51) Int. Cl.
| | |
|---|---|
| H03K 3/03 | (2006.01) |
| H03L 1/02 | (2006.01) |
| H03L 7/099 | (2006.01) |
| H03K 3/011 | (2006.01) |

(52) U.S. Cl.
CPC ............. *H03K 3/0315* (2013.01); *H03K 3/011* (2013.01); *H03L 1/022* (2013.01); *H03L 7/0995* (2013.01); *H03L 2207/50* (2013.01)

(58) Field of Classification Search
CPC .................................................... H03K 3/0315
USPC ........................................................ 331/57
See application file for complete search history.

(56) References Cited

U.S. PATENT DOCUMENTS

| | | | |
|---|---|---|---|
| 8,115,559 B2* | 2/2012 | Kim ..................... | H03K 3/0322 331/17 |
| 2004/0012449 A1 | 1/2004 | Illegems | |
| 2006/0082419 A1* | 4/2006 | Sakaguchi ............. | H03K 3/011 331/57 |
| 2008/0106345 A1* | 5/2008 | Huang ................. | H03K 3/0315 331/57 |
| 2011/0084743 A1* | 4/2011 | Chen .................... | H03K 3/0315 327/157 |
| 2012/0223780 A1 | 9/2012 | Urakawa | |
| 2013/0335148 A1 | 12/2013 | Kousai et al. | |

FOREIGN PATENT DOCUMENTS

| | | |
|---|---|---|
| JP | 2004-048690 A | 2/2004 |
| JP | 2012-191275 A | 10/2012 |
| JP | 2013-054471 A | 3/2013 |
| WO | 2004/008639 A2 | 1/2004 |

* cited by examiner

*Primary Examiner* — Joseph Chang
(74) *Attorney, Agent, or Firm* — Patterson & Sheridan, LLP

(57) ABSTRACT

An oscillation circuit includes a ring oscillator and a current generating circuit. The ring oscillator includes a control terminal. The current generating circuit generates a current according to a voltage of the control terminal in the ring oscillator, and supplies the current to the control terminal. The ring oscillator includes a plurality of delay stages connected to each other in a ring shape. Each of the delay stages includes an inverter and a capacitance element. The inverter includes a power source side node, an input node, and an output node. The power source side node is connected to the control terminal. The capacitance element is connected as a load for the inverter. The capacitance value of the capacitance element is larger than a parasitic capacitance at the output node.

13 Claims, 5 Drawing Sheets

OSCILLATION CIRCUIT AND PHASE SYNCHRONIZATION CIRCUIT

CROSS-REFERENCE TO RELATED APPLICATION

This application is based upon and claims the benefit of priority from Japanese Patent Application No. 2014-151181, filed Jul. 24, 2014, the entire contents of which are incorporated herein by reference.

FIELD

Exemplary embodiments described herein relate to an oscillation circuit and a phase synchronization circuit.

BACKGROUND

An oscillation circuit is built in a semiconductor device, and is configured to supply generated periodic pulses to a circuit block within the semiconductor device. To stabilize the operation of the circuit block, it is desirable to cause the oscillating frequency of the oscillation circuit to have less variation with regard to ambient temperature.

DETAILED DESCRIPTION

Embodiments provide, for example, an oscillation circuit and a phase synchronization circuit that reduces variation in the oscillating frequency of the oscillation circuit with regard to the ambient temperature.

In general, according to an exemplary embodiment, an oscillation circuit includes a ring oscillator and a current generating circuit. The ring oscillator includes a control terminal. The current generating circuit generates a current according to a voltage of the control terminal in the ring oscillator, and supplies the current to the control terminal. In the ring oscillator, delay elements in a plurality of stages are connected to each other in a ring shape. Each of the delay elements in the plurality of stages includes an inverter and a capacitance element. The inverter includes a power source side node, an input node, and an output node. The power source side node is connected to the control terminal. The capacitance element is connected as a load for the inverter. The capacitance value of the capacitance element is larger than a parasitic capacitance at the output node.

Oscillation circuits according to embodiments are described in detail with reference to the accompanying drawings but the invention is not limited by these embodiments.

(First Embodiment)

Figure 1:
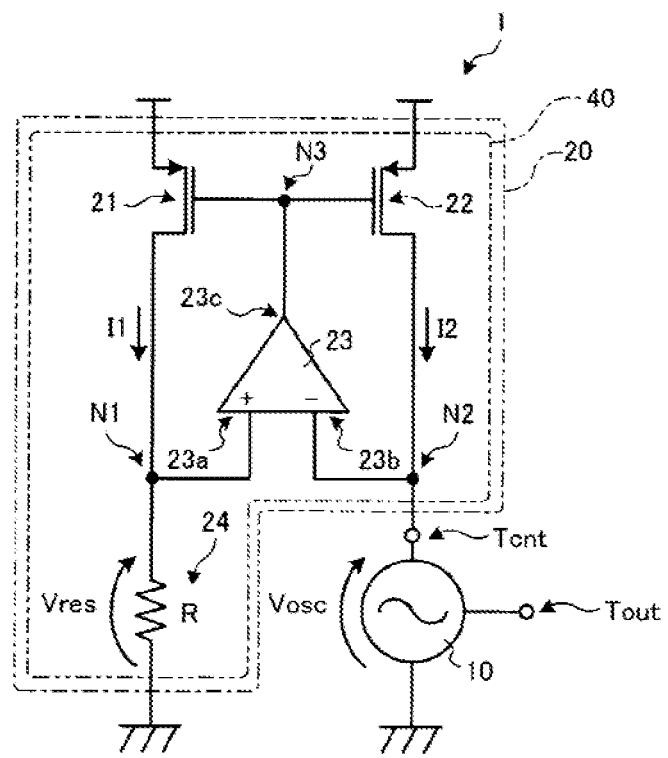
FIG. 1 is a circuit diagram illustrating the structure of an oscillation circuit according to a first embodiment.

An oscillation circuit 1 according to a first embodiment is described. FIG. 1 is a circuit diagram illustrating the configuration of the oscillation circuit 1.

The oscillation circuit 1 is built in a semiconductor device, and supplies generated periodic pulses to a circuit block within the semiconductor device. The oscillation circuit 1 includes a ring oscillator 10 and a current generating circuit 20 as shown in FIG. 1. The ring oscillator 10 includes a control terminal Tcnt and an output terminal Tout.

The current generating circuit 20 generates a drive current I2 according to a voltage Vosc of the control terminal Tcnt in the ring oscillator 10, and supplies the drive current I2 to the control terminal Tcnt. The current generating circuit 20 includes a current generating section 40. The current generating section 40 generates the drive current I2 according to the voltage Vosc of the control terminal Tcnt. The current generating section 40 includes current source transistors 21 and 22, a differential amplifier circuit 23, and a resistor element 24.

The differential amplifier circuit 23 includes a non-inverting input terminal 23a which is connected to a node N1 between the current source transistor 21 and the resistor element 24, an inverting input terminal 23b which is connected to a node N2 between the current source transistor 22 and the ring oscillator 10, and an output terminal 23c which is connected to a node N3 connected to the gates of the respective current source transistors 21 and 22. The differential amplifier circuit 23 controls a voltage to be applied to the gates of the respective current source transistors 21 and 22 through the node N3 such that the potential difference between the voltage Vosc of the control terminal Tcnt and a voltage Vres generated due to the drop of a voltage of the resistor element 24 (resistance value: R), approaches zero. That is, the differential amplifier circuit 23 causes the voltage Vosc to be equal to the voltage Vres. Therefore, the voltage Vres becomes a value which is substantially equal to the voltage Vosc, and a current I1 (=Vres/R), which is proportional to the voltage Vres, flows through the node N1. Since the gate-source voltages of the respective current source transistors 21 and 22 are substantially equal to each other, the current (drive current) I2 which flows to the side of the node N2 becomes a value (for example, substantially equal value) which is proportional to the current I1. Therefore, it is possible to supply the drive current I2, which is proportional to the voltage Vosc of the control terminal Tcnt, to the control terminal Tcnt of the ring oscillator 10.

The ring oscillator 10 oscillates at a frequency according to the value of the drive current I2 which is received in the control terminal Tcnt, and outputs the periodic pulses from the output terminal Tout to the circuit block within the semiconductor device. The circuit block is synchronized with the periodic pulses supplied from the ring oscillator 10, and performs a predetermined operation. If the frequency of the periodic pulses generated by the ring oscillator 10 varies widely due to a change in ambient temperature, the jitter of the periodic pulses can easily exceed a timing margin of the circuit block, and thus there is a possibility that the circuit block does not operate as intended. In order to ensure correct operation of the circuit block, it is necessary to cause the oscillating frequency of the oscillation circuit 1 to have less variation with regard to the ambient temperature.

Here, in the first embodiment, the variation in the oscillating frequency of the ring oscillator 10 with regard to the ambient temperature is reduced by the internal configuration of the ring oscillator 10.

Figure 2:
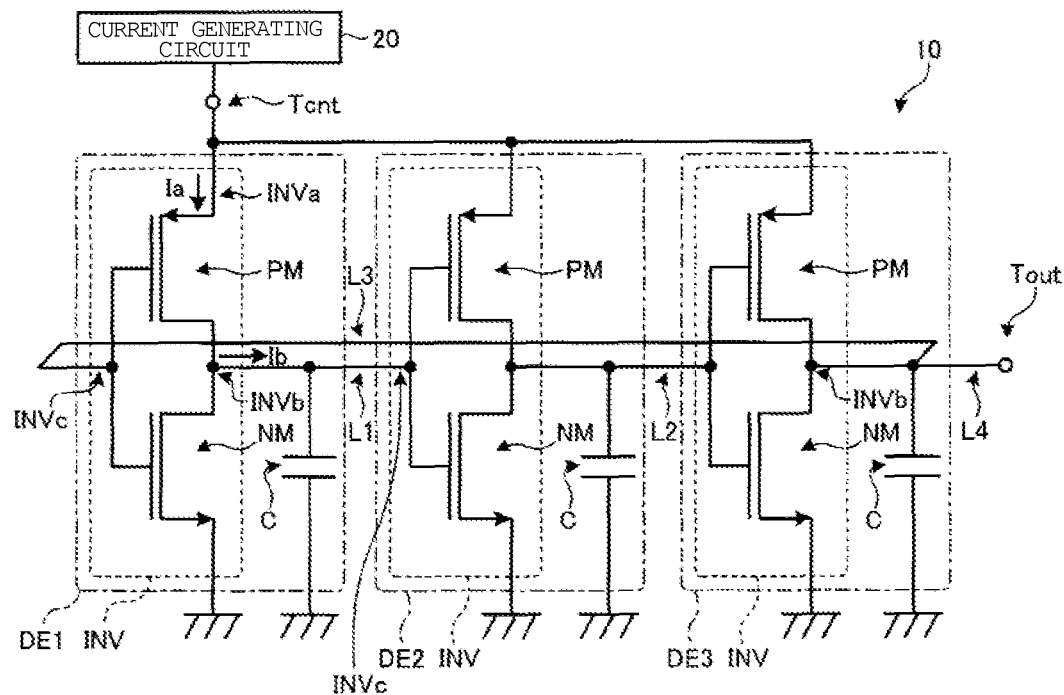
FIG. 2 is a circuit diagram illustrating the configuration of a ring oscillator according to the first embodiment.

More specifically, the ring oscillator 10 includes delay elements DE1 to DE3 in a plurality of stages, which are connected in a ring shape, as shown in FIG. 2. FIG. 2 is a circuit diagram illustrating the configuration of the ring oscillator 10. The delay element DE1 in a first stage is connected to the delay element DE2 in a second stage through an output line L1. The delay element DE2 in the second stage is connected to the delay elements DE3 in the last stage through an output line L2. The delay element DE3 in the last stage is connected to the delay element DE1 in the first stage through an output line L3. In addition, the delay element DE3 in the last stage is connected to the output terminal Tout through an output line L4.

Although FIG. 2 illustrates an example of a case in which the ring oscillator 10 includes the delay elements DE1 to DE3 in three stages, the ring oscillator 10 may include the delay elements in $(2^K+1)$ stages when K is an integer which is equal to or greater than 2.

The respective delay elements DE1 to DE3 in the respective stages include inverters INV and capacitance elements C. In the delay element DE1, the inverter INV includes a PMOS transistor PM, an NMOS transistor NM, a power source side node INVa, an input node INVc, and an output node INVb. The inverters INV in the respective stages have properties which are equivalent to each other. The PMOS transistors PM in the respective stages have dimensions (=W/L, W: gate width and L: gate length) which are substantially equal to each other. The NMOS transistors NM in the respective stages have dimensions which are substantially equal to each other. The capacitance elements C in the respective stages have properties which are substantially equivalent to each other. The capacitance elements C in the respective stages have capacitance values which are substantially equal to each other.

For example, in the delay element DE1, the power source side node INVa is a node on the side of the source of the PMOS transistor PM and is connected to the control terminal Tcnt. The input node INVc is a node which is connected to the respective gates of the PMOS transistor PM and the NMOS transistor NM, and is connected to the input node INVc of the inverter INV of the delay elements DE3 in the prior stage through the output line L3. The output node INVb is a node which is connected to the respective drains of the PMOS transistor PM and the NMOS transistor NM, and is connected to the input node INVc of the inverter INV of the delay elements DE2 in the next stage through the output line L1.

A capacitance element C determines the amount of delay of the output node INVb. For example, the capacitance element C is connected as a load. The element includes one end which is connected to the output line L1 and the other end which is connected to ground potential. The capacitance value of the capacitance element C is determined to be sufficiently large compared to the amount of variation in a parasitic capacitance Cdelay, which includes the gate capacitance and the wiring capacitance in the inverter INV, with regard to the ambient temperature or the operation state. That is, the capacitance value of the capacitance element C is determined such that the current Ia, which flows through the power source side node INVa, and the current Ib, which flows through the output node INVb, are substantially equal to each other when the ring oscillator 10 is operated. The current Ia, which flows through the power source side node INVa, indicates a current acquired by long-term (e.g., hourly) averaging a current which flows through the power source side node INVa while the inverter INV is excessively operated. The current Ib, which flows through the output node INVb, indicates a current acquired by long-term averaging a current which flows through the output node INVb while the inverter INV is excessively operated.

When the capacitance value of the capacitance element C, which has less temperature or voltage dependency, is sufficiently large compared to the amount of variation in the parasitic capacitance Cdelay with regard to the ambient temperature or operation temperature, it is possible to significantly reduce the temperature dependency of the total capacitance C+Cdelay driven by the inverter. In addition, when the capacitance value of the capacitance element C is sufficiently large compared to the amount of variation in the parasitic capacitance Cdelay with regard to the ambient temperature or the operation state, it is possible to charge the capacitance element C with the most of charge according to a voltage to be transmitted from the inverter INV of the delay element DE1 to the inverter INV of the delay element DE2 in the next stage. Therefore, a time (delay time) for transmitting signal from the inverter INV of the delay element DE1 to the inverter INV of the delay element DE2 in the next stage is determined mainly by the current and the capacitance C.

When each of the delay elements DE1 to DE3 in the respective stages does not include the capacitance element C, the current Ia, which flows through the power source side node INVa, is different from the current Ib, which flows through the output node INVb, and the current Ia and the current Ib relatively vary according to the ambient temperature T, and thus the following Expression 1 holds for the difference ΔI between the current Ia and the current Ib.

$$\Delta I(T) = Ia - Ib \neq \text{Constant} \qquad \text{Expression 1}$$

Expression 1 expresses that there are some components which are discharged to the ground potential without contributing to the oscillating operation of the ring oscillator 10 among currents which are supplied to the power source side node INVa in the inverter INV. The oscillating frequency Fosc of the ring oscillator 10 is affected by the difference in current ΔI (T) expressed in Expression 1, leading to a large temperature dependency.

In contrast, in the embodiment, each of the delay elements DE1 to DE3 in the respective stages includes the capacitance element C and the capacitance value of the capacitance element C is sufficiently large compared to the parasitic capacitance Cdelay, leading to Expression 2.

$$Ib/(Ia) \approx 1 (\because C >> C\text{delay}) \qquad \text{Expression 2}$$

If Expression 1 is replaced with Expression 2, Expression 3 results.

$$\Delta I(T) \approx 0 \qquad \text{Expression 3}$$

Expression 3 indicates that the components, which are discharged to the ground potential without contributing to the oscillating operation of the ring oscillator 10, are small enough to be ignored compared to currents which are supplied to the power source side node INVa in the inverter INV, according to the capacitance element C.

Here, if the capacitance value of the capacitance element C is set to C, the voltage of the control terminal Tcnt is set to Vosc, the value of the drive current I2 (≈ the value of current I1) is set to I, the voltage of the node N1 (refer to FIG. 1) is set to Vres, and the resistance value of the resistor element 24 is set to R, the following Expression 4 holds for the oscillating frequency Fosc of the ring oscillator 10.

$$Fosc \propto 1/((C + Cdelay) \times Vosc) \approx 1/(C \times Vosc) \quad \text{Expression 4}$$
$$= (Vres/R)/(C \times Vres)$$
$$= 1/(C \times R)$$

From expression 4 it is clear that the oscillating frequency Fosc of the ring oscillator 10 has no relation with the operational voltage Vosc, and depends on mainly the capacitance value C and the resistance value R from Expression 4. The capacitance value C and the resistance value R have significantly low temperature dependency compared to ΔI(T) expressed in Expression 1. That is, it is possible to cause the oscillating frequency of the oscillation circuit 1 to be substantially constant with regard to the ambient temperature T.

Figure 3:
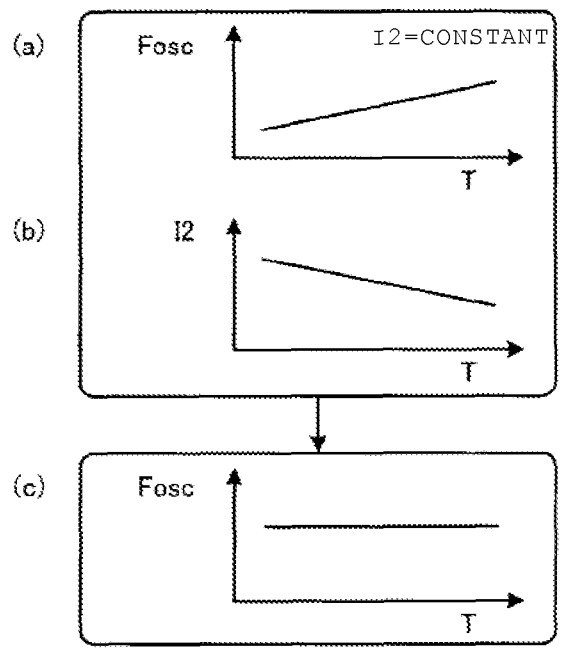
FIG. 3 is a diagram illustrating the operation of the oscillation circuit according to the first embodiment.

As illustrated in (a) of FIG. 3, when the drive current I2 is constant, the oscillating frequency Fosc of the ring oscillator 10 varies with a positive slope with regard to the ambient temperature T. The reason for this is that the capacitance C does not change, the threshold of an MOS has a negative slope with regard to the temperature, and oscillation frequency is increased in accordance with the rise of the temperature.

In contrast, in the first embodiment, the drive current I2 is changed in proportion to the variation in the oscillation frequency due to the change in the temperature as shown in (b) of FIG. 3, and thus it is possible to maintain the oscillating frequency Fosc of the oscillation circuit 1 constant with regard to the ambient temperature T as shown in (c) of FIG. 3. FIG. 3 is a waveform diagram illustrating the operation of the oscillation circuit 1.

As described above, in the first embodiment, in the oscillation circuit 1, each of the delay elements DE1 to DE3 in the respective stages of the ring oscillator 10 includes the capacitance element C in the output node INVb of the inverter INV, in addition to the inverters INV. The capacitance value of the capacitance element C is determined such that the current Ia, which flows through the power source side node INVa, is substantially equal to the current Ib, which flows through the output node INVb, in the inverter INV. Therefore, compared to a case in which each of the delay elements DE1 to DE3 in the respective stages does not include the capacitance element C, it is possible to reduce the variation in the oscillating frequency Fosc of the ring oscillator 10 with regard to the ambient temperature T.

In addition, in the first embodiment, in the oscillation circuit 1, the current generating circuit 20 generates the drive current I2 according to the voltage Vosc of the control terminal Tcnt of the ring oscillator 10 and supplies the drive current I2 to the control terminal Tcnt. The current generating circuit 20 generates the drive current I2 which has a temperature property that compensates for the temperature property of the oscillating frequency of the ring oscillator 10. Therefore, it is possible to cause the oscillating frequency Fosc of the oscillation circuit 1 to be substantially constant with regard to the ambient temperature T. Therefore, it is possible to acquire an oscillating frequency, which is little affected by external environment, with low power consumption and a small area.

Figure 4:
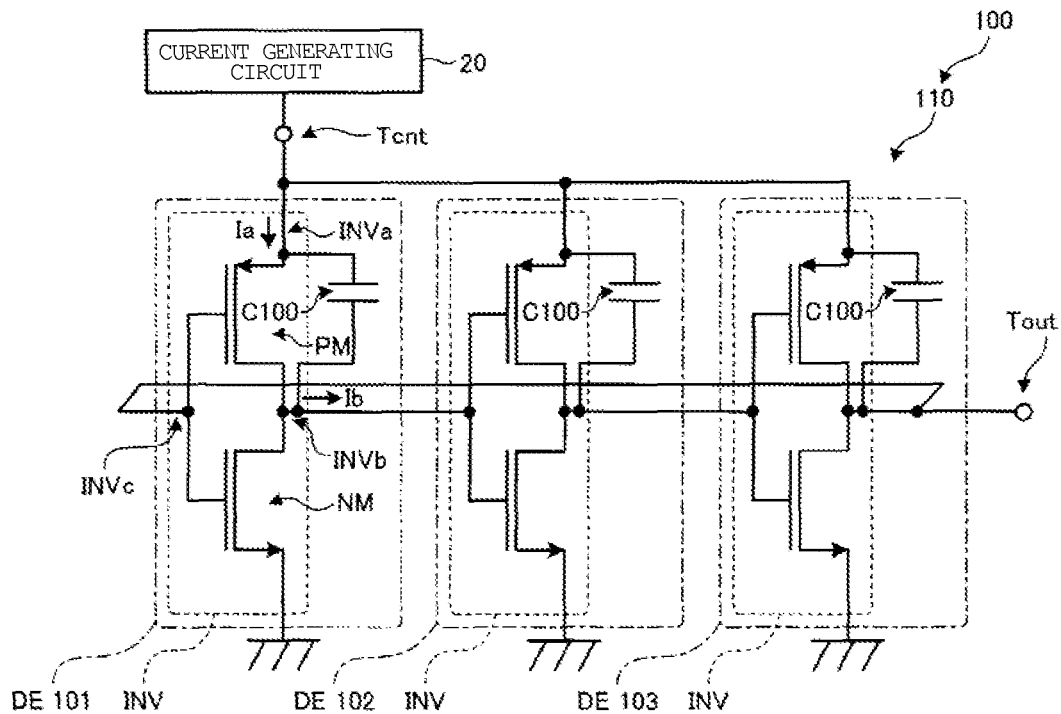
FIG. 4 is a circuit diagram illustrating the configuration of a ring oscillator according to a modified example of the first embodiment.

Alternatively, as shown in FIG. 4, in a ring oscillator 110 of an oscillation circuit 100, each of delay elements DE101 to DE103 in the respective stages may include a capacitor C100 as a load to the inverter instead of the capacitance element C (refer to FIG. 2). FIG. 4 is a circuit diagram illustrating the configuration of the ring oscillator 110. The capacitor C100 is connected between a power source side node INVa and an output node INVb. For example, the capacitance element C100 includes one end which is connected to the source of the PMOS transistor PM and the other end which is connected to the output node INVb of the inverter INV. The capacitance value of the capacitance element C100 is determined to be sufficiently large compared to parasitic capacitance Cdelay which includes gate capacity and wiring capacity in an inverter INV. That is, the capacitance value of the capacitance element C100 is determined such that a current Ia, which flows through the power source side node INVa, is substantially equal to a current Ib, which flows through the output node INVb, when the ring oscillator 110 is operated.

As described above, when the capacitance value of the capacitance element C100 is sufficiently large compared to the parasitic capacitance Cdelay, it is possible to cause the temperature dependency of the total capacitance C+Cdelay, which is driven by the inverter, to be significantly small. In addition, when the capacitance value of the capacitance element C100 is sufficiently large compared to the parasitic capacitance Cdelay, it is possible to charge the capacitance element C100 with the most of charge according to a voltage to be transmitted from the inverter INV of the delay element DE101 to the inverter INV of the delay element DE102 in the next stage. Therefore, it is possible to determine a time (delay time) for transmitting a signal from the inverter INV of the delay element DE101 to the inverter INV of the delay element DE102 in the next stage mainly by the current and the capacity C.

(Second Embodiment)

An oscillation circuit 400 according to a second embodiment is next described. Hereinafter, the description focuses on parts which are different from the first embodiment.

In the first embodiment, when the ambient temperature T of the ring oscillator 10 is extremely high, a current (leakage current), which flows through a path which is originally off in the transition state of the ring oscillator 110, is likely to be large. Therefore, the component, which is discharged to the ground potential without contributing to the oscillating operation, increases in the current which is supplied to each of the delay elements DE1 to DE3 in the respective stages (refer to FIG. 2), and thus there is a possibility that the frequency Fosc is reduced.

Here, in the second embodiment, the influence of the leakage current under ultra-high temperature is substantially canceled by the current generating circuit 420.

Figure 5:
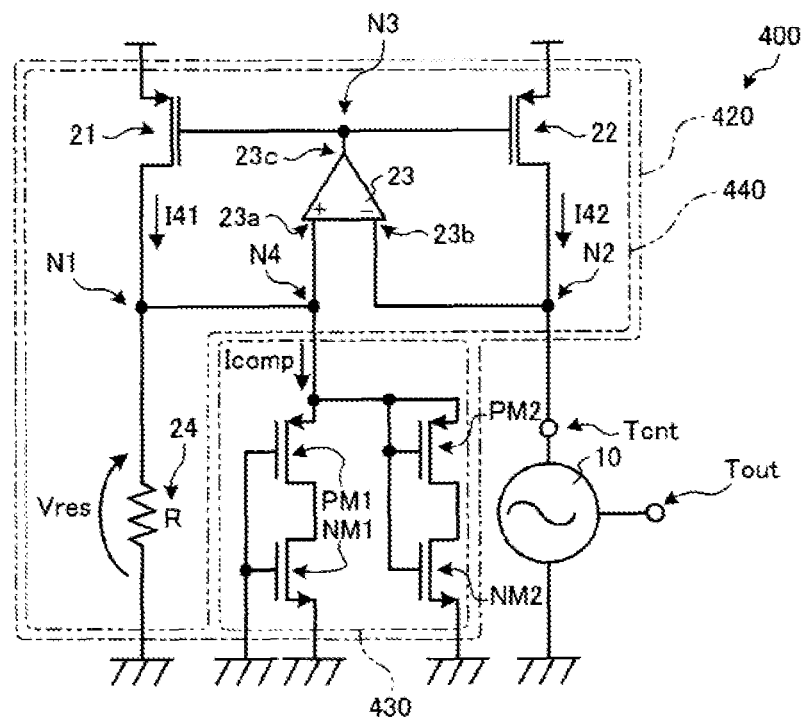
FIG. 5 is a circuit diagram illustrating the configuration of an oscillation circuit according to a second embodiment.

More specifically, in the oscillation circuit 400, the current generating circuit 420 includes a current generating section 440 instead of the current generating section 40 (in FIG. 1), and further includes a compensation current generating section 430 as shown in FIG. 5. FIG. 5 is a block diagram illustrating the configuration of the oscillation circuit 400.

The compensation current generating section 430 has properties which are equivalent to that of a non-switching inverter within the ring oscillator. For example, the compensation current generating section 430 is equivalent to a circuit in which a first stage delay element is being operated from among three-staged delay elements DE1 to DE3 and remaining two-stages are off (a ground voltage and a control voltage are input).

The compensation current generating section 430 causes a compensation current Icomp to flow through a node N4.

The node N4 is a node between a node N1 and the non-inverting input terminal 23a of a differential amplifier circuit 23. The compensation current generating section 430 includes PMOS transistors PM1 and PM2 and NMOS transistors NM1 and NM2. Each of the PMOS transistors PM1 and PM2 corresponds to the PMOS transistor PM in each stage in the ring oscillator 10. The dimension (=W/L, W: gate width and L: gate length) of each of the PMOS transistors PM1 and PM2 is substantially equal to the dimension of the PMOS transistor PM in each stage in the ring oscillator 10.

Each of the NMOS transistors NM1 and NM2 corresponds to the NMOS transistor NM in each stage in the ring oscillator 10. The dimension (=W/L, W: gate width and L: gate length) of each of the NMOS transistors NM1 and NM2 is substantially equal to the dimension of the NMOS transistor NM in each stage in the ring oscillator 10.

In addition, the PMOS transistor PM1 includes a gate which is connected to ground potential (reference potential). The NMOS transistor NM1 includes a gate which is connected to the ground potential (reference potential). Therefore, the PMOS transistor PM1 and the NMOS transistor NM1 achieves the operation state of the inverter INV to which a ground voltage is input in a pseudo manner and achieves a property which is equivalent to that of the inverter INV to which the ground voltage is input as a load.

In addition, the PMOS transistor PM2 includes a gate which is connected to the source of the PMOS transistor PM1. The NMOS transistor NM2 includes a gate which is connected to the source of the PMOS transistor PM1. Therefore, the PMOS transistor PM2 and the NMOS transistor NM2 achieves the operation state of the inverter INV, to which a control voltage is input, in the pseudo manner, and achieves a property which is equivalent to that of the inverter INV to which the control voltage is input as a load.

If current starts to flow through the inverter INV which is originally turned off under ultra-high temperature, the current which does not contribute to oscillation increases in the ring oscillator 110. As a result, when the oscillating frequency is lowered, the current (compensation current Icomp), which is equivalent to the current which does not contribute to oscillation, flows to the compensation current generating section 430. Therefore, a current (drive current I42) which is supplied from the current generating section 440 to the ring oscillator 110 increases for the same reason that the voltage Vres, which is generated in a resistor R at high temperature, is lowered in the first embodiment. As a result, almost all currents, which are generated in the resistor R, contribute to the oscillating operation, and thus it is possible to reduce the lowering of the oscillating frequency Fosc under the ultra-high temperature.

The current generating section 440 generates a drive current I42 acquired by adding the compensation current Icomp generated in the compensation current generating section 430 to a current I41 generated in the resistor R according to the voltage Vres of the node N1. The compensation current Icomp has a current value which is substantially equivalent to the current which does not contribute to oscillation in the ring oscillator 10. That is, the current generating section 440 generates the current (drive current I42) acquired in such a way that a current according to the voltage of the control terminal Tcnt of the ring oscillator 10 is compensated by the compensation current Icomp. The current generating section 440 supplies the generated drive current I42 to the control terminal Tcnt of the ring oscillator 10.

As described above, in the second embodiment, the compensation current generating section 430 generates the compensation current Icomp, which is equivalent to the current which does not contribute to oscillation in the ring oscillator 10, in the current generating circuit 420 of the oscillation circuit 400. The current generating section 440 generates the drive current I42, which is acquired by compensating the current according to the voltage of the control terminal Tcnt of the ring oscillator 10 by the compensation current Icomp generated by the compensation current generating section 430, and supplies the drive current I42 to the control terminal Tcnt of the ring oscillator 10. Therefore, when the ambient temperature T of the ring oscillator 10 is extremely high, it is possible to cancel the influence of the leakage current which is generated in the ring oscillator 10, and thus it is possible to maintain the frequency property of the ring oscillator 10 under ultra-high temperature. That is, when the ambient temperature T of the ring oscillator 10 is extremely high, it is possible to reduce the lowering of the oscillating frequency Fosc of the ring oscillator 10, and thus it is possible to cause the oscillating frequency Fosc of the oscillation circuit 400 to be substantially constant with regard to the ambient temperature T over a wide temperature range.

In addition, in the second embodiment, in the current generating circuit 420 of the oscillation circuit 400, the compensation current generating section 430 includes the PMOS transistors PM1 and PM2, which correspond to the PMOS transistors PM in the respective stages of the ring oscillator 10, and the NMOS transistors NM1 and NM2 which correspond to the NMOS transistors NM in the respective stages. The PMOS transistor PM1 includes a gate which is connected to the ground potential (reference potential). The NMOS transistor NM1 includes a gate which is connected to the ground potential (reference potential). Therefore, the PMOS transistor PM1 and the NMOS transistor NM1 may achieve the operation state of the inverter INV to which the grand voltage is input in the pseudo manner, and achieves a property which is equivalent to that of the inverter INV to which the ground voltage is input as a load. In addition, the PMOS transistor PM2 includes a gate which is connected to the source of the PMOS transistor PM1. The NMOS transistor NM2 includes a gate which is connected to the source of the PMOS transistor PM1. Therefore, the PMOS transistor PM2 and the NMOS transistor NM2 achieves the operation state of the inverter INV, to which the control voltage is input, in the pseudo manner, and achieves a property which is equivalent to that of the inverter INV to which the control voltage is input as a load. That is, it is possible to generate the compensation current Icomp, which is equivalent to the leakage current which is generated by the turned-off inverter and does not contribute to oscillation, within the ring oscillator 10 as the voltages on the sides of the sources of PMOS transistors PM1 and PM2.

Meanwhile, FIG. 5 illustrates a case in which the ring oscillator 10 includes the delay elements DE1 to DE3 in three stages as an example. However, in a case in which the ring oscillator 10 includes the delay elements in $(2^K+1)$ stages when K is an integer which is equal to or greater than 2, it is possible to acquire the same advantage by a grounded inverter in a $(2^{K-1})$-th stage and an inverter which is connected to the control voltage ($\approx$Vres) in the $(2^{K-1})$-th stage.

(Third Embodiment)

Subsequently, an oscillation circuit 200 according to a third embodiment is described. Hereinafter, the description focuses on parts which are different from the first embodiment.

In the first embodiment, if the oscillating frequency Fosc of the ring oscillator 10 is extremely low, the variation in the voltage Vosc of the control terminal Tcnt of the ring oscillator 10 is high, and thus the variation in the voltage Vosc is observed as the variation in the oscillating frequency Fosc.

For example, the voltage Vosc of the control terminal Tcnt of the ring oscillator 10 varies at a frequency according to the oscillating frequency Fosc of the ring oscillator 10. If the varying frequency of the voltage Vosc of the control terminal Tcnt is higher than the frequency (cut-off frequency) which may be followed by the differential amplifier circuit 23, the differential amplifier circuit 23 equalizes the variation in the period of the voltage Vosc to some extent and copies the variation in the period into the voltage Vres on the side of the node N1. However, if the oscillating frequency Fosc of the ring oscillator 10 is extremely lowered and the varying frequency of the voltage Vosc is equal to or less than the frequency (cut-off frequency) which may be followed by the differential amplifier circuit 23, the differential amplifier circuit 23 copies the voltage Vosc into the voltage Vres while including components for the variation in the period. Therefore, the current I1 periodically varies and the drive current I2 also periodically varies, and thus the fluctuation in the oscillating frequency Fosc of the ring oscillator 10 is generated.

Here, in the third embodiment, the fluctuation in the oscillating frequency Fosc, acquired when the oscillating frequency Fosc of the ring oscillator 10 is extremely lowered, is suppressed by the current generating circuit 220.

Figure 6:
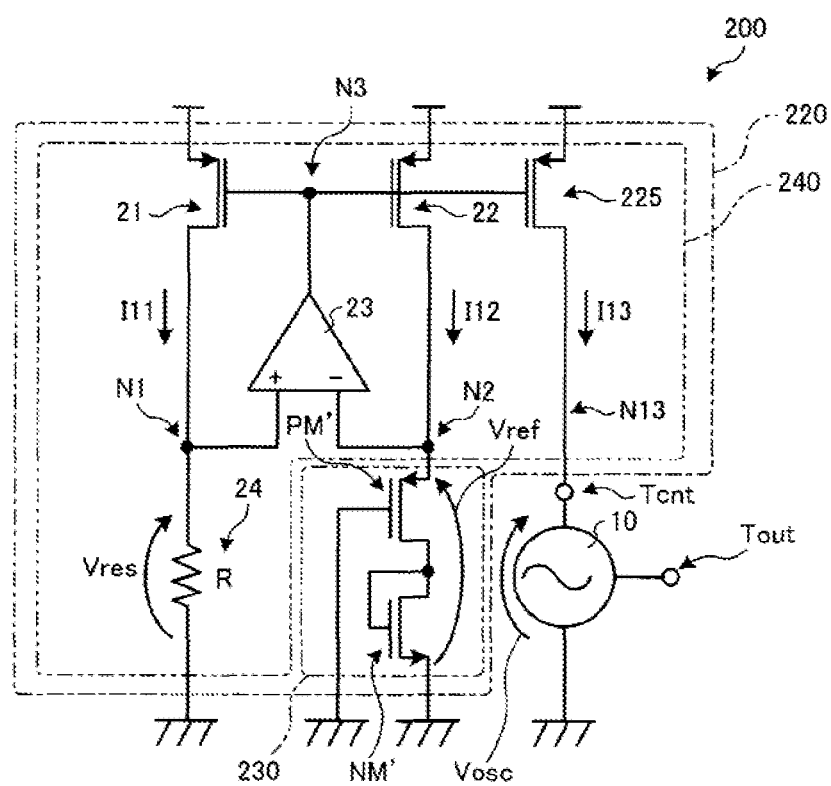
FIG. 6 is a block diagram illustrating the configuration of an oscillation circuit according to a third embodiment.

More specifically, in the oscillation circuit 200, the current generating circuit 220 includes a current generating section 240 instead of the current generating section 40 (refer to FIG. 1), and further includes a reference voltage generating section 230 as shown in FIG. 6. FIG. 6 is a block diagram illustrating the configuration of the oscillation circuit 200.

The reference voltage generating section 230 has a property which is equivalent to that of the ring oscillator 10, acquired when an operation is performed, as a load. That is, the reference voltage generating section 230 generates a reference voltage Vref, which is equivalent to the voltage Vosc of the control terminal Tcnt, when the ring oscillator 10 is operated. The reference voltage Vref is substantially equal to a voltage acquired by long-term (e.g., hourly) averaging the voltage Vosc of the control terminal Tcnt while including time in which the inverters INV (refer to FIG. 2) in the respective stages perform transitional operations.

The reference voltage generating section 230 includes a PMOS transistor PM' and an NMOS transistor NM'. The PMOS transistor PM' corresponds to the PMOS transistor PM in each stage in the ring oscillator 10. The dimension (=W/L, W: gate width and L: gate length) of the PMOS transistor PM' is substantially equal to the dimension of the PMOS transistor PM in each stage in the ring oscillator 10.

The NMOS transistor NM' corresponds to the NMOS transistor NM in each stage in the ring oscillator 10. The dimension (=W/L, W: gate width and L: gate length) of the NMOS transistor NM' is substantially equal to the dimension of the NMOS transistor NM in each stage in the ring oscillator 10.

In addition, the PMOS transistor PM' includes a gate which is connected to ground potential (reference potential). The NMOS transistor NM' includes a gate which is connected to a drain. Therefore, the PMOS transistor PM' and the NMOS transistor NM' achieves a long-term-averaged operation state of the inverter INV in each stage in a pseudo manner, and achieves a property which is equivalent to that of the inverter INV in each stage as a load. That is, it is possible to generate the reference voltage Vref as a voltage on the side of the source of the PMOS transistor PM'.

The current generating section 240 receives the reference voltage Vref, which is generated by the reference voltage generating section 230, generates a drive current I13 according to the reference voltage Vref, and supplies the drive current I13 to the control terminal Tcnt of the ring oscillator 10.

The current generating section 240 further includes a current source transistor 225. In the current generating section 240, a differential amplifier circuit 23 controls a voltage to be applied to the gate of each of the current source transistors 21, 22, and 225 such that the potential difference between the reference voltage Vref, which is generated by the reference voltage generating section 230, and the voltage Vres, which is generated due to the drop of the voltage of the resistor element 24 (resistance value: R), approaches zero. That is, the differential amplifier circuit 23 causes the reference voltage Vref to be equal to the voltage Vres. Therefore, because the voltage Vres has a value which is substantially equal to the reference voltage Vref, a current I11 (=Vres/R) which is proportional to the voltage Vres flows into the side of the node N1. Since the gate-source voltages of the respective current source transistors 21, 22, and 225 are substantially equal to each other, both the current I12 which flows to the side of the node N2 and the current (drive current) I13 which flows to the side of the node N13 become a value (for example, substantially equal value) which is proportional to the current I11. Therefore, it is possible to supply the drive current I13, which is substantially proportional to the voltage Vosc of the control terminal Tcnt, to the control terminal Tcnt of the ring oscillator 10.

As described above, in the third embodiment, in the current generating circuit 220 of the oscillation circuit 200, the reference voltage generating section 230 generates the reference voltage Vref which is equivalent to the voltage Vosc of the control terminal Tcnt when the ring oscillator 10 is operated. The reference voltage Vref is substantially equal to a voltage acquired by long-term (e.g., hourly) averaging the voltage Vosc of the control terminal Tcnt while including time in which the inverter INV in each stage (refer to FIG. 2) of the ring oscillator 10 performs a transitional operation. The current generating section 240 generates the drive current I13 according to the reference voltage Vref, which is generated by the reference voltage generating section 230, and supplies the drive current I13 to the control terminal Tcnt of the ring oscillator 10. Therefore, when the oscillating frequency Fosc of the ring oscillator 10 is extremely lowered, it is possible to suppress the variation in the period of the voltage Vres and it is possible to suppress the variation in the period of the current I11. Therefore, it is possible to suppress the variation in the period of the drive current I13. That is, the frequency varies less with regard to the variation in the temperature, and thus it is possible to output periodic pulses in which fluctuation (jitter) in the output frequency is reduced.

In addition, in the third embodiment, in the current generating circuit 220 of the oscillation circuit 200, the reference voltage generating section 230 includes the PMOS transistor PM' which corresponds to the PMOS transistor PM in each stage of the ring oscillator 10 and the NMOS transistor NM' which corresponds to the NMOS transistor PM in each stage. The PMOS transistor PM' includes a gate which is connected to ground potential (reference potential). The NMOS transistor NM' includes a gate which is connected to a drain. Therefore, the PMOS transistor PM' and the NMOS transistor NM' may achieve an operation state, acquired by long-term averaging the inverter INV in each stage, in a pseudo manner, and may achieve a property which is equivalent to that of the inverter INV in each stage as a load. That is, it is possible to generate reference voltage Vref which is equivalent to the voltage Vosc of the control terminal Tcnt as a voltage on the side of the source of the PMOS transistor PM'.

(Fourth Embodiment)

An oscillation circuit 300 according to a fourth embodiment is described. Hereinafter, the description focuses on parts which are different from the third embodiment.

Figure 7:
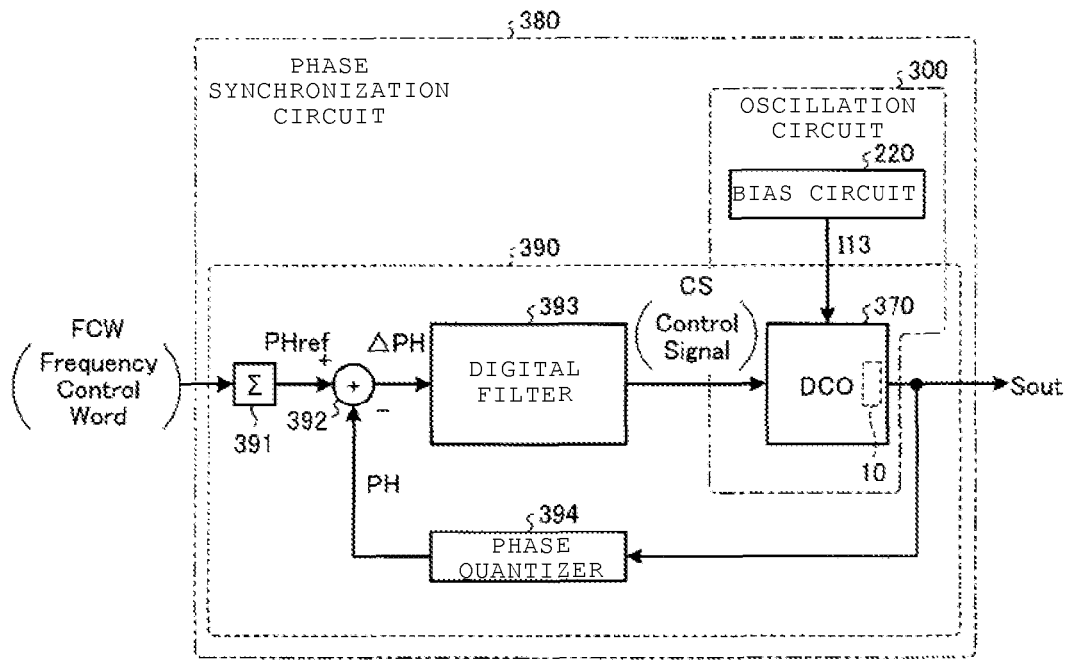
FIG. 7 is a circuit diagram illustrating the configuration of a phase synchronization circuit which includes an oscillation circuit according to a fourth embodiment.

In the fourth embodiment, improvement is performed such that an oscillation circuit 300 is applied to a phase synchronization circuit 380. The oscillation circuit 300 includes a digitally controlled oscillator (DCO) 370, which includes the ring oscillator 10, instead of the ring oscillator 10 (in FIG. 6), as shown in FIG. 7. That is, in the phase synchronization circuit 380, the current generating circuit 220 according to the third embodiment is applied to a digital PLL 390 which includes the DCO 370. FIG. 7 is a circuit diagram illustrating the configuration of the phase synchronization circuit 380.

In the digital PLL (All-Digital PLL) 390, control is performed such that an operation is performed at a desired frequency by converting current for driving the ring oscillator 10 to a digital control signal CS. In the ring oscillator 10, the temperature property of an oscillating frequency with regard to a certain fixed current has a positive temperature property, as described above. Here, when a bias circuit, which cancels the temperature property of the ring oscillator 10, is used, it is possible to suppress the variation in the control signal CS in the drawing due to the variation in temperature. Therefore, it is not necessary to consider the amount of variation in temperature for an oscillation range which is necessary for the ring oscillator 10. When the oscillation circuit 300 is a circuit which has a narrow oscillation range (low gain), influence on an output with regard to the variation in environment is small, and thus it is possible to acquire stable oscillation output.

More specifically, the digital PLL 390 includes an accumulator 391, a subtractor (phase comparison section) 392, a digital filter (control section) 393, a phase quantizer (quantization section) 394, and the DCO 370.

The accumulator 391 receives a Frequency Control Word (FCW) from the outside. The frequency control word FCW includes a ratio of the reference oscillating frequency Fc of the DCO 370 to the frequency Fref of the reference signal REF. The accumulator 391 generates reference phase information PHref by long-term (e.g., hourly) integrating the frequency control word FCW, and supplies the generated reference phase information PHref to the subtractor 392.

The phase quantizer 394 generates phase information PH acquired by discretizing the phase of a periodic pulses Sout output from the oscillation circuit 300 for each period Tref of the reference signal REF, and supplies the generated phase information PH to the subtractor 392.

The subtractor 392 acquires phase error information ΔPH according to the reference phase information PHref and the phase information PH of the periodic pulses. That is, the subtractor 392 subtracts the phase information PH from the reference phase information PHref, and supplies a result of the subtraction to a digital filter 393 as the phase error information ΔPH.

The digital filter 393 controls the oscillating frequency Fosc of the oscillation circuit 300 according to the phase error information ΔPH. That is, the digital filter 393 generates an N+1-bit control signal CS[N:0] such that a phase difference which is indicated by the phase error information ΔPH approaches zero. The digital filter 393 supplies the generated N+1-bit control signal CS[N:0] to the DCO 370.

The DCO 370 performs an oscillating operation at the oscillating frequency Fosc by the ring oscillator 10 while using the drive current I13, which is supplied from the current generating circuit 220, in response to the N+1-bit control signal CS[N:0]. The DCO 370 generates the periodic pulses Sout, which has a frequency according to the oscillating frequency Fosc, and outputs the generated periodic pulses Sout. Here, the current generating circuit 220 generates the drive current I13 which has the temperature property determined to counteract the temperature property of the oscillating frequency Fosc of the ring oscillator 10, and reduce the variation in the period of the drive current I13 when the oscillating frequency Fosc of the ring oscillator 10 is low. The DCO 370 converts the drive current I13 into the drive current I14 in response to the N+1-bit control signal CS[N:0], and supplies the drive current I14 to the control terminal Tcnt of the ring oscillator 10.

Figure 8:
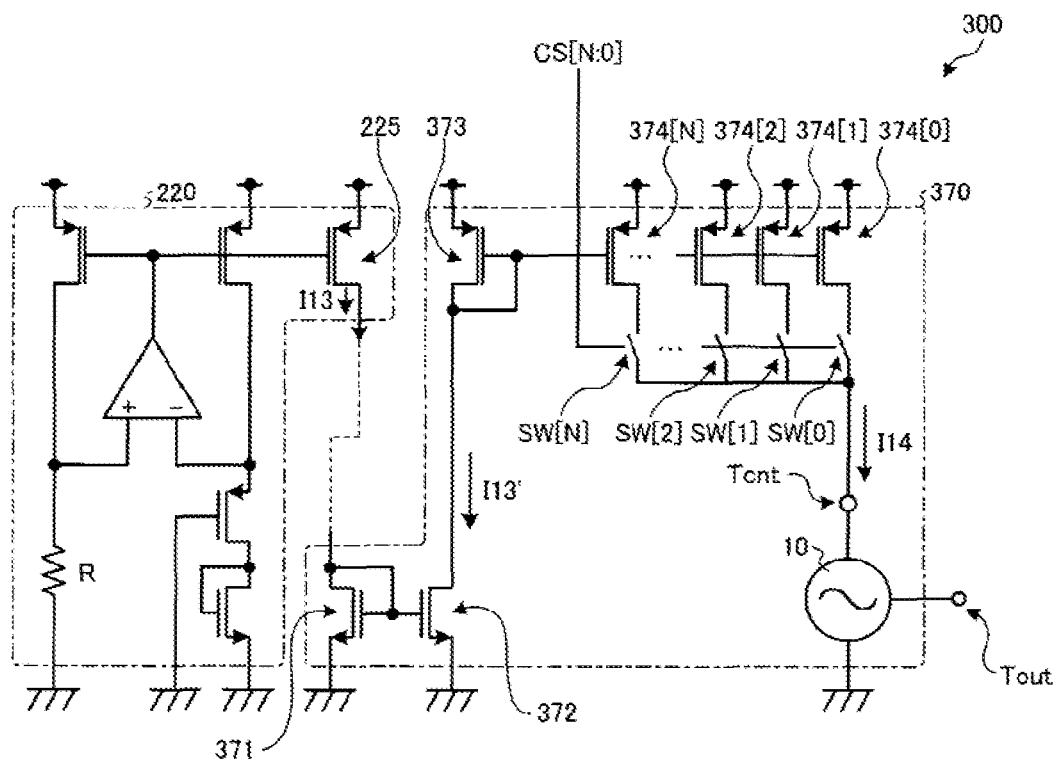
FIG. 8 is a circuit diagram illustrating the configuration of the oscillation circuit according to the fourth embodiment.

For example, the DCO 370 includes a plurality of current source transistors 371 to 373, a plurality of bias transistors 374[N] to 374[0], and a plurality of switches SW[N] to SW[0], as shown in FIG. 8. FIG. 8 is a circuit diagram illustrating the configuration of the oscillation circuit 300. The current source transistors 371 and 372 form a current mirror circuit, and copy the drive current I13, which is directly received from the current source transistor 225 of the current generating circuit 220 or indirectly received through another circuit, as drive current I13' to a line on the side of the current source transistors 372 and 373.

The plurality of switches SW[N] to SW[0] correspond to an N+1-bit control signal CS[N:0], and correspond to the plurality of bias transistors 374[N] to 374[0]. Each of the switches SW[N] to SW[0] is turned on when the corresponding bit of the N+1-bit control signal CS[N:0] becomes an active value (for example, "1") and activates the corresponding bias transistor 374. Each of the switches SW[N] to SW[0] is turned off when the corresponding bit of the N+1-bit control signal CS[N:0] becomes a non-active value (for example, "0") and deactivates the corresponding bias transistor 374.

The current source transistor 373 forms the current mirror circuit, together with the activated bias transistor 374 of the plurality of bias transistors 374 [N] to 374[0], and copies the drive current I13' at a predetermined ratio.

For example, the dimensions of the bias transistors 374 [N], ..., 374[2], 374[1], and 374[0] are set to $2^N D, \ldots, 2^2 D, 2^1 D$, and $2^0 D$. Therefore, it is possible to set the drive capacitance of the bias transistors 374[N], ..., 374[2], 374[1], and 374[0] to $2^N I, \ldots, 2^2 I, 2^1 I$, and $2^0 I$. Therefore, it is possible to change a ratio that the drive current I13' is converted into the drive current I14 according to the N+1-bit control signal CS[N:0] in a binary manner. That is, it is possible to consider a configuration, which includes the plurality of current source transistors 371 to 373, the plurality of bias transistors 374[N] to 374[0], and the plurality of switches SW[N] to SW[0], as a current conversion circuit which converts the drive current I13' into the drive current I14 at a ratio according to the N+1-bit control signal CS[N:0].

As described above, in the fourth embodiment, in the oscillation circuit 300, the current generating circuit 220 generates the drive current I13 which has the temperature property determined to counteract the temperature property of the oscillating frequency Fosc of the ring oscillator 10, and reduce the variation in the period of the drive current I2 when the oscillating frequency Fosc of the ring oscillator 10 is low. The DCO 370 converts the drive current I13 into the drive current I14 depending on the N+1-bit control signal CS[N:0], and supplies the drive current I14 to the control terminal Tcnt of the ring oscillator 10. Therefore, it is possible to control the oscillating frequency Fosc of the DCO 370 without considering temperature dependency in the phase synchronization circuit 380 which includes the DCO 370, and thus it is possible to easily stabilize the operation of the digital PLL 390.

Meanwhile, a controller (not illustrated in the drawing) may cause the phase synchronization circuit 380 to stop after storing the control signal CS in a nonvolatile memory, a magnetic recording medium, or the like at a certain time point. When the phase synchronization circuit 380 restarts, the controller reads the control signal CS from the nonvolatile memory or the magnetic recording medium and sets the control signal CS for the digital filter 393. Therefore, even after external environment is changed, it is possible to cause the phase synchronization circuit 380 to restart at a frequency which is the same as before the phase synchronization circuit 380 stops.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An oscillation circuit comprising:
   a ring oscillator having a control terminal, an oscillation frequency of the ring oscillator being controllable by a drive current supplied to the control terminal; and
   a current generating circuit configured to adjust the drive current to a level corresponding to a voltage of the control terminal and supply the drive current to the control terminal,
   wherein the ring oscillator includes at least three delay elements connected in a ring shape,
   wherein each delay element includes:
      an inverter having a power source side node connected to the control terminal, an input node, and an output node; and
      a capacitance element connected to the output node of the inverter and having a capacitance larger than a parasitic capacitance of the inverter at the output node,
   wherein the input node of the inverter in each delay element is connected to the output node of the inverter in a different delay element,
   wherein the current generating circuit includes a current setting resistor and the drive current is controlled to be proportional to a voltage across the current setting resistor,
   wherein the current generating circuit further includes:
      a compensation current generating section configured to generate a compensation current that is equivalent to a leakage current which does not contribute to oscillation in the ring oscillator; and
      a current generating section configured to generate the drive current by adding the compensating current to a current proportional to the voltage across the current setting resistor,
   wherein each inverter includes a first PMOS transistor and a first NMOS transistor, and
   wherein the compensation current generating section includes:
      a second PMOS transistor that corresponds in operational characteristics to the first PMOS transistor;
      a second NMOS transistor that corresponds in operational characteristics to the first NMOS transistor;
      a third PMOS transistor that corresponds in operational characteristics to the first PMOS transistor; and
      a third NMOS transistor that corresponds in operational characteristics to the first NMOS transistor.

2. The oscillation circuit according to claim 1, wherein the capacitance element in each delay element is connected between the respective output node of the delay element and a reference potential.

3. The oscillation circuit according to claim 1, wherein the capacitance element of each delay element is connected between the respective power source side node and the output node of each delay element.

4. The oscillation circuit according to claim 1, wherein
   the second PMOS transistor includes a gate which is connected to the reference potential,
   the second NMOS transistor includes a gate which is connected to the reference potential,
   the third PMOS transistor includes a gate which is connected to a source of the third PMOS transistor, and
   the third NMOS transistor includes a gate which is connected to the source of the third PMOS transistor.

5. The oscillation circuit according to claim 1 in a phase synchronization circuit, the phase synchronization circuit comprising:
   a quantization section configured to generate phase information according to a phase of a periodical pulse which is output from the oscillation circuit;
   a phase comparison section configured to acquire phase error information according to reference phase information and the phase information of the periodical pulse; and
   a control section configured to control the oscillating frequency of the oscillation circuit according to the phase error information.

6. An oscillation circuit comprising:
   a ring oscillator having a control terminal, an oscillation frequency of the ring oscillator being controllable by a drive current supplied to the control terminal; and
   a current generating circuit configured to adjust the drive current to a level corresponding to a voltage of the control terminal and supply the drive current to the control terminal,
   wherein the ring oscillator includes at least three delay elements connected in a ring shape,
   wherein each delay element includes:
      an inverter having a power source side node connected to the control terminal, an input node, and an output node; and
      a capacitance element connected to the output node of the inverter and having a capacitance larger than a parasitic capacitance of the inverter at the output node,
   wherein the input node of the inverter in each delay element is connected to the output node of the inverter in a different delay element, wherein the current generating circuit includes a current setting resistor and the drive current is controlled to be proportional to a voltage across the current setting resistor, and wherein the current generating circuit further includes:

a reference voltage generating section configured to generate a reference voltage which is equivalent to the voltage of the control terminal when the ring oscillator is operated; and a current generating section configured to generate a current according to the reference voltage.

7. The oscillation circuit according to claim 6, wherein each inverter includes a first PMOS transistor and a first NMOS transistor; and wherein the reference voltage generating section includes:
a second PMOS transistor that corresponds in operational characteristics to the first PMOS transistor; and
a second NMOS transistor that corresponds in operational characteristics to the first NMOS transistor.

8. An oscillation circuit comprising:

a ring oscillator having a control terminal through which a drive current for the ring oscillator is supplied, an output terminal through which a signal oscillating at a frequency is supplied, the frequency being controllable by varying the drive current, and an odd number of adjacent delay stages having input and output nodes coupled together to form a ring; and a current generating circuit that includes:
a differential amplifier having a first input terminal connected to a first node, a second input terminal connected to a second node, and an output node connected to a third node,
a first current source transistor connected between a first voltage and the first node,
a second current source transistor connected between the first voltage and the second node,
gates of the first and second current source transistors being connected to the third node,
a current setting resistor connected between the first node and ground voltage,
a second voltage at the second node corresponding to a ring oscillator voltage at the control terminal generated by operation of the ring oscillator, wherein the drive current is controlled to correspond to current flowing through the first node, and the current generating circuit further includes:
a voltage reference circuit connected to the second node and configured to supply an average reference voltage to the current setting resistor to control current in the current setting resistor; and
a current mirror configured to supply the drive current to the control terminal proportional to the current in the current setting resistor.

9. The oscillation circuit according to claim 8, wherein each delay stage includes an inverter circuit and a capacitive load; and wherein each inverter circuit includes:
a power source side node connected to the control terminal;
a connection to a reference potential;
an output node to which the capacitive load is attached; and
an input node connected to the output node of an adjacent delay stage.

10. The oscillation circuit according to claim 9, wherein the capacitive load has a value that is greater than a parasitic capacitance at the output node of the respective delay stage.

11. The oscillation circuit according to claim 10, wherein the value of the capacitive load is such that an average current that flows through the power source side node is substantially equal to an average current which flows through the output node.

12. The oscillation circuit according to claim 8, wherein the current generating circuit further includes:
a drive circuit under control of a digital control signal to supply a current proportional to current in the current mirror, the proportion being set by the digital control signal.

13. The oscillation circuit according to claim 12, wherein the digital control signal is derived from an output of a digital filter configured to filter a difference between a phase quantized version of the signal output from the ring oscillator and a phase reference signal.

* * * * *